United States Patent [19]

Iruvanti et al.

[11] Patent Number: 5,098,609
[45] Date of Patent: Mar. 24, 1992

[54] STABLE HIGH SOLIDS, HIGH THERMAL CONDUCTIVITY PASTES

[75] Inventors: Sushumna Iruvanti, Wappingers Falls; Rakesh K. Gupta, Williamsville; Eli Ruckenstein, Amherst, all of N.Y.

[73] Assignee: The Research Foundation of State Univ. of N.Y., Albany, N.Y.

[21] Appl. No.: 431,283

[22] Filed: Nov. 3, 1989

[51] Int. Cl.$^5$ .................. H01B 1/06; C08L 91/00
[52] U.S. Cl. .................. 252/511; 252/514; 252/518; 252/521; 252/516; 252/510; 252/512; 252/502; 252/509; 252/503; 252/504; 252/506; 106/266; 524/401; 524/439; 524/404; 524/408; 524/441; 524/430; 524/432; 524/433; 523/514
[58] Field of Search .............. 252/512, 506, 514, 509, 252/518, 521, 500, 502, 510, 511, 503, 504; 106/266, 287.17, 287.18, 287.19, 287.34, 287.35; 524/401, 404, 408, 439, 440, 441, 430, 432, 433; 523/512, 514–516

[56] References Cited

U.S. PATENT DOCUMENTS

| | | | |
|---|---|---|---|
| 3,778,287 | 12/1973 | Stansfield et al. | 106/308 |
| 3,885,984 | 5/1975 | Wright | 106/287 |
| 4,265,775 | 5/1981 | Aakalu et al. | 252/573 |

FOREIGN PATENT DOCUMENTS 0114000 12/1983 European Pat. Off.
1441433 7/1974 United Kingdom.

*Primary Examiner*—Josephine Barr

[57] ABSTRACT

A paste including a thermally conducting solid filler, a nonaqueous liquid carrier and a stabilizing dispersant. The pastes are highly concentrated, of low viscosity, electrically resistive, highly thermally conducting and stable. The pastes are easily applicable to electrical and electronic devices and may be removed therefrom with common solvents to access components where necessary.

14 Claims, 4 Drawing Sheets

STABLE HIGH SOLIDS, HIGH THERMAL CONDUCTIVITY PASTES

BACKGROUND OF THE INVENTION

In order to achieve greater computer speeds and to miniaturize electronic devices, denser packaging of the active components becomes essential. However, such denser packaging is practicable only when the heat generated is speedily carried away from the active components. Frequently the components are mounted on a heatsink and are also enclosed by a cold cap. The major resistance to heat flow is generally in gaps. The gaps may be between the active component and the housing or between the active component and the heatsink or between the housing and the heatsink.

Prior thermal packaging compounds involved mostly resin or rubber based formulations which need curing or setting, such as curable polymeric resins. Such rubbery or rigid encapsulating materials may trap minute quantities of air at the interface and therefore may not provide effective thermal contact between the heat transfer surfaces. In addition, they are not easily removable to give accessibility to the active components, if necessary. Thermally conducting compositions have been made as exemplified by U.S. Pat. No. 3,885,984 to Wright and U.S. Pat. No. 4,265,775 to Aakalu et.al. The patent to Wright discloses a composition comprising a methyl alkyl polysiloxane and a thickener. The patent to Aakalu et al. discloses a composition including silica fibers. Generally, prior thermal compositions do not have high thermal conductivity and low viscosity for high solid loading and they may not be stable. European Patent 0114000 to C. Lien et al. also discloses a thermally conducting slurry. The particle size of the particles in the slurry is about 150 microns. In accordance with the European patent, there is solid liquid separation of the slurry. In fact, it is desirous for the particles to settle. Therefore, this composition is not stable.

Therefore, there still exists a need for a product which is stable, (over a few years), with regard to liquid separation and has high thermal conductivity and high electrical resistivity. This is difficult since normally those materials which have good thermal conductivity are also usually electrically conductive. In addition, there is a need for a product which will provide good thermal contact between the heat transfer surfaces and will accommodate different shapes and sizes of the circuit components.

Furthermore, there is a need for a compound which can be applied as a thin film. There is also a need for a compound which will withstand thermo mechanical variations encountered in electronic device applications without significant loss of its properties and finally there is a need for a compound which can be completely removed with common solvents to provide accessibility to the active components where necessary.

SUMMARY OF THE INVENTION

The invention comprises a paste, said paste comprising a thermally conducting solid filler, a nonaqueous electrically resistive liquid carrier and a stabilizing dispersant said paste being highly concentrated, stable and electrically resistive.

Accordingly, an overall object of the invention is to provide a compliant, easily applicable, elastic, highly thermally conducting, highly electrically resisting compound, which can be removed when necessary to provide access to active components.

A more particular object is to increase the solid loading and thereby paste conductivity, while maintaining stability and moderate viscosity in solid liquid dispersions. It is shown that significant increases in solid loading are achievable with almost one order of magnitude decrease in viscosity by using a distribution of particle sizes and an effective dispersant.

Other objects of the invention will become apparent to those skilled in the art from the following detailed description.

BRIEF DESCRIPTION OF THE FIGURES

FIG. 1b shows the effect of mixed particle grades and of dispersants on paste viscosity. The effect is shown for a higher volume percent (74) than FIG. 1a.

DETAILED DESCRIPTION OF THE INVENTION

Figure 1A:
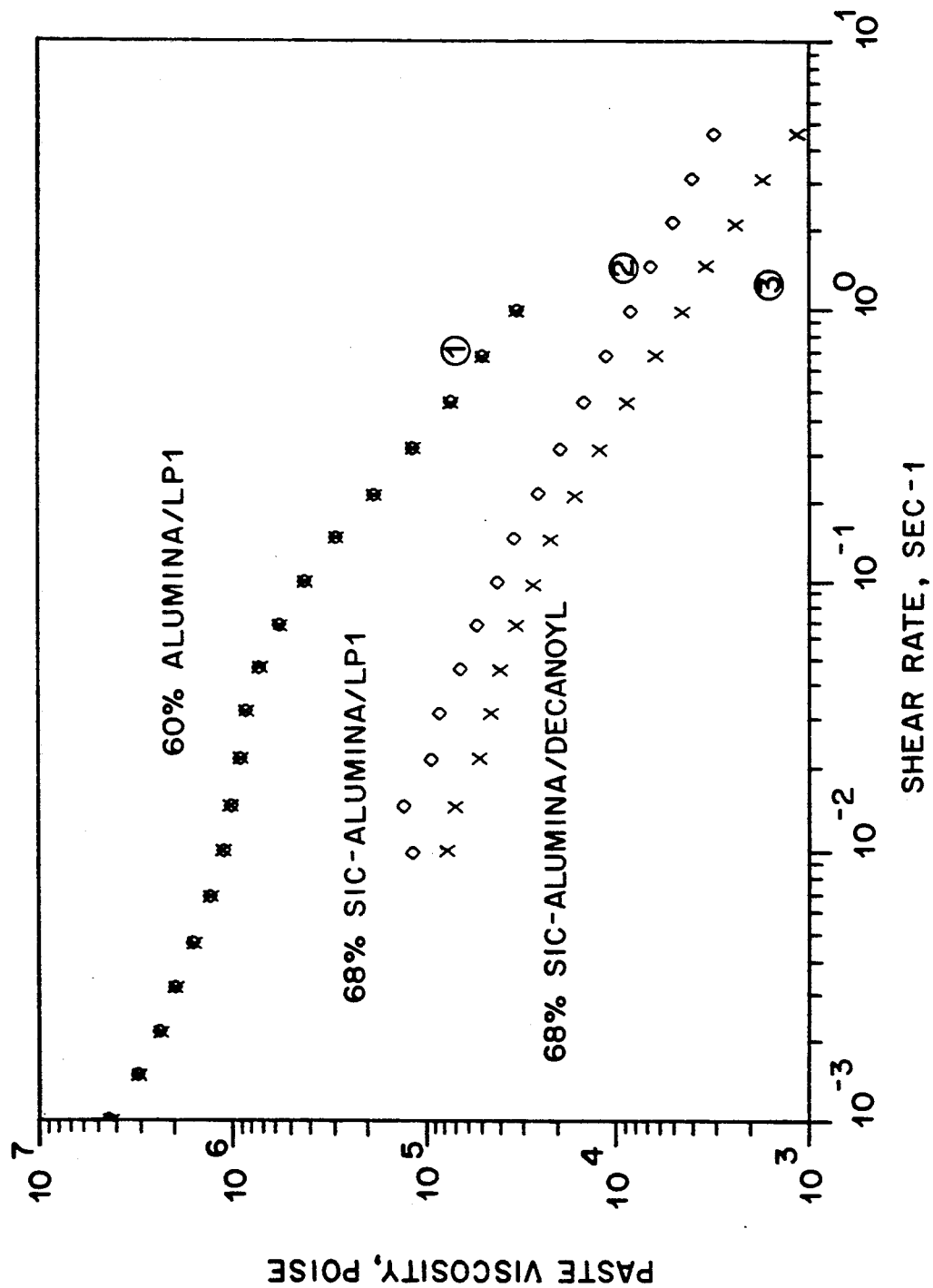
FIG. 1a shows the effect of mixed particle grades and of dispersants on paste viscosity.

A paste is a mixture of a powder and a liquid. The pastes of this invention are highly concentrated. Highly concentrated as used herein means comprising at least about 55 vol % solids. Preferred vol % of solids is about 60 to about 78.

The solid filler is generally a highly thermally conducting metallic filler or a ceramic filler or a combination of both. By highly thermally conducting is meant about 1.0 Watt/mK, preferably 30 Watt/mK or greater thermal conductivity. Examples of metallic fillers for use in accordance with this invention include Al, Cu, and Ag. Metallic fillers may be preferred because they are usually better thermal conductors, and as such they may increase the thermal conductivity of the paste. Examples of ceramic fillers are SiC, AlN, BN, Diamond, VB, $VB_2$, $Al_2O_3$, ZnO, MgO, and $SiO_2$. Examples of the preferred ceramic fillers include SiC, AlN, BN, Diamond, VB, $VB_2$ and $Al_2O_3$. Ceramic fillers are sometimes preferred because they are better electrical insulators thus increasing the dielectric strength of the paste. Mixtures of types of fillers may be used, e.g., a plurality of metallic fillers, a plurality of ceramic fillers or mixtures of ceramic and metallic fillers may be used. Mixtures of metallic and ceramic fillers may allow the dielectric strength and thermal conductivity of the pastes to be tailored to a desired balance. It is preferred if the particle sizes of the solid fillers are between $0.05\mu$ and $10\mu$. It is to be understood that there is a size distribution of particles for the filler.

The paste is comprised of, at most about 45 vol % of a liquid carrier, preferably between 5–40 vol %. Liquid carriers are compatible, insulating nonaqueous liquids having low viscosity (one to a few hundred poise). By compatible is meant that the liquid carrier utilized will not interfere with the other components of the invention. Examples of suitable carriers are paraffinic hydrocarbons, such as mineral oil, Silicone Oils, e.g., (polydimethyl siloxanes), mixtures of glycerides, halogenated hydrocarbons, olefinic hydrocarbons, aromatic hydrocarbons and mixtures of two or more of the above carriers. In general, the carrier provides a continuous phase which in conjunction with the dispersant separates and lubricates the particles. For electrically insulating pastes, the liquid carrier in general, electrically insulates particles of the dispersed filler. It is preferable that, for such electrically insulating pastes, the solid fillers are electrically insulating as well. Metallic fillers such as Aluminum may be made to have an electrically insulating oxide surface to render it electrically insulating. For example, the metallic filler may be exposed to air, or controlled oxidation to provide the oxide surface.

Between about 1 to about 20 wt % (based on filler weight) of a stabilizing dispersant is incorporated into the paste. Stabilizing dispersants as used herein are substances which will inhibit liquid-solid separation and which will facilitate incorporation of more solid fillers into the paste. Examples of stabilizing dispersants are monomeric acids; monomeric, oligomeric and/or polymeric fatty acid esters and salts thereof; petroleum sulfonates; and polyimides. Examples of monomeric fatty acids include octanoic acid and oleic acid. Examples of fatty acid esters are the reaction products of hydroxy stearic acid and a 5-18 carbon acid or acid chloride. Preferred dispersants are fatty acid esters which are the reaction product of 12 hydroxy stearic acid (12 HSA) and a 5-10 carbon aliphatic acid chloride, or 5-8 carbon alicyclic acid chloride or aromatic acid chloride. Also, polyester as disclosed in U.S. Pat. No. 3,778,287 to Stansfield and Hypermers may be utilized as the stabilizing dispersant.

The reaction product of 12 HSA and a 5-18 carbon, acid chloride may be formed as described herebelow: The starting material is 12 hydroxy stearic acid:

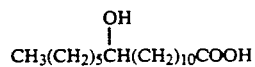

The (OH) group on the side chain can be reacted to add other molecules ranging from short chain and long chain aliphatics to aromatics. The OH group can be reacted with the acidic form of the added molecule However, it would be more efficient to react 12 HSA with the corresponding acid chloride of the molecule.

The following are examples of 5-18 carbon acid chlorides which may be used in accordance with the above: (1) stearoyl chloride; (2) decanoyl chloride; (3) valeryl chloride; and (4) benzoyl chloride. In addition, 12 HSA may also be reacted with itself to yield a polymeric/oligomeric dispersant to be used in accordance with the invention.

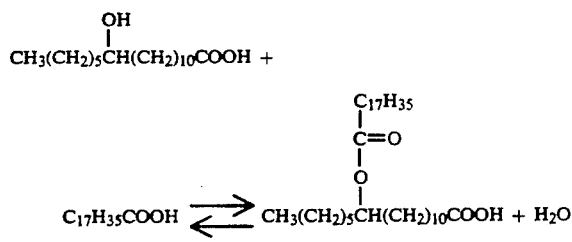

The above dispersants may be made by any means known to those skilled in the art. A suitable method is as follows:

The required stoichiometric amounts of the reactants are weighed out into a 3-neck flask. One of the reactants may be added in excess to better the yield. The reaction is carried out under toluene reflux conditions (110° C.) in a nitrogen atmosphere for 48-72 hours. Xylene reflux (=140° C.) may also be used. Upon completion of the reaction, the toluene is evaporated away by heating, and the product separated by any known means.

Hypermers are commercially available polymeric fatty acid esters. Suitable Hypermers may be obtained from ICI Specialty Chemicals. Characteristics of Hypermers LP1 through KD4 are listed in the following table.

TABLE 1

| Hypermer Polymeric Dispersant | Appearance | Activity | Anchoring Mechanism | Melting Point | Effective Polarity Range | Specific Gravity | Viscosity-Poise |
|---|---|---|---|---|---|---|---|
| LP1 | Amber Waxy Paste/Viscous Liquid. Slight Cloudiness | 100% | Single | Pourable 25° C. | Low | 0.91 | 20–30 at 25° C. |
| LP2 | Blue Powder | 100% | Synergist | Above 250° C. | Low-Medium | 1.26 | N/A |
| LP3 | Light Brown Waxy/Paste Viscous Liquid. Slight Cloudiness | 100% | Single | Pourable 35° C. | Low | 0.94 | Not less than 130 at 50° C. |
| LP4 | Amber Waxy Paste/Viscous Liquid. Slight Cloudiness | 100% | Single | Pourable 35° C. | Low | 0.93 | 16–22 at 35° C. |
| LP5 | Amber Waxy Paste/Viscous Liquid. Slight Cloudiness. | 100% | Single | Pourable 35° C. | Low | 0.93 | 25–35 at 50° C. |
| LP6 | Amber Liquid | 40% in High Boiling Petroleum Fraction | Polymeric | N/A | Low | 0.84 | 5–9 at 25° C. |
| LP7 | Amber Liquid | 45% in DOP | Polymeric | N/A | Low | 0.99 | 128 at 25° C. |
| LP8 | Amber Liquid | 40% in Tol- | Polymeric | N/A | Low | 0.920 | .7–1.0 at 25° C. |

| Hypermer Polymeric Dispersant | Appearance | | Melting Point °C. (1) | Specific Gravity | Viscosity (cps) | Effective Solvent Polarity Range |
|---|---|---|---|---|---|---|
| KD3 | Amber Liquid/paste | | Pourable 25° C. | 0.92 | 1600–2200 at 35° C. | Non-polar |
| KD4 | Amber liquid/paste | | Pourable | 0.91 | 2000–3000 | Non-polar |

TABLE 1-continued

HYPERMER POLYMERIC DISPERSANTS

| | 25° C. | at 25° C. |
|---|---|---|

Notes:
(1) HYPERMER LP1, HYPERMER LP3, HYPERMER LP4 and HYPERMER LP5 are polymeric materials which do not show a sharp melting point, but change from solid to liquid over a range of temperatures near room temperature. The 100% Hypermer Liquids do not boil but decompose without boiling above 250° C.
(2) The above data are for typical batches and do not constitute a specification.
DOP = dioctylphthalate It is within the scope of this invention that each component (solid filler, liquid carrier and stabilizing dispersant) of the invention may be composed of 1 or more of the suitable compounds. For example, for the solid filler, AlN and $Al_2O_3$ may be combined and used as the filler.

The pastes are stable against liquid separation (in some cases up to 20 years), are of low viscosity ($10^6 - 10^3$ poise over a low shear rate range of $10^{-3}$ to $10^1$ sec$^{-1}$, i.e., the pastes are shear thinning) and are adequately sticky to form good thermal contacts between the heat transfer surfaces. The pastes can be easily squeezed as thin or thick films, and with suitable additives, known to these skilled in the art, shaped (i.e. molded or extruded), tape cast or drawn. The pastes may also be elastic to accommodate thermo mechanical variations such as those encountered in electrical and electronic applications and the resulting stresses. The pastes are highly thermally conducting i.e., they have a thermal conductivity greater than about 1.0 Watt/mK. The preferred embodiments have thermal conductivities of 3-6 Watt/mK.

The concentrated thermal pastes comprising the above components may be made by any means known to those skilled in the art. Generally the dispersant and the liquid carrier are blended and then the solid filler is added gradually with continual stirring. This inhomogeneous mixture of the solids and liquids is then milled using any known means to produce a homogeneous paste. The paste may then be stored or used in the desired application.

The following examples and preparations describe the manner and process of making and using the invention and set forth the best mode contemplated by the inventors of carrying out the invention, but are not to be construed as limiting.

EXAMPLE 1

The concentrated thermal paste was made as follows:
Step 1: 7.55 g of Hypermer LP1 (about 5%, based on the weight of filler plus dispersant) was thoroughly blended into 9.56 g of mineral oil ($\approx$ 1.8 poise). A household type blender fitted with an industrial grade motor was used for the blending.

Step 2: Two different grades of solid fillers were weighed out i.e., 78.96 g, 3600 grit SiC (available from General Abrasives) and 65.05 g Al6SG grade alumina (60:40 volume ratio) and were used to obtain a high loading paste i.e., 68 vol %. Al6SG is a commercial grade of sub-micron alumina (available from Alcoa) having a $\alpha$-$Al_2O_3$ phase content, an average size of 0.5$\mu$ and a surface area of 7-11 $m^2$/g. These fillers were then added gradually with continual stirring to the dispersant-liquid carrier mixture prepared in Step 1. Most of the alumina was added first to the liquid and then the SiC was added. The rest of the alumina and SiC was added at the end. This inhomogeneous mixture of the solids and liquid was then blended on a 3-roll mill for 30 min. The mixture usually becomes more fluid after blending on the 3-roll mill. The paste was then stored in jars.

RESULTS

The long term storage/usage stability was assessed by noting the liquid separation on accelerated testing of a small amount of the sample in an ultra centrifuge at 16000 RPM for 1-3 h. 1 h of centrifuging at 16000 RPM in this particular centrifuge would theoretically correspond to a shelf-life of 3.5 years. The viscosity Vs. shear rate data for a 68 vol % silicon carbidealumina paste (SiC/$Al_2O_3$ in 60:40 volume ratio) was compared against a 60 vol % alumina (100% alumina, no second filler) paste.

In the figures: LP1 is a hypermer listed in Table 1; Al6SG and A2750 are described herein; Decanoyl, Benzoyl etc. refer to dispersants obtained by reacting 12 HSA with Decanoyl Chloride, Benzoyl Chloride etc., respectively. Unless specified, "alumina" in these figures refers to Al6SG grade. The volume ratio of SiC/Alumina is 60/40. The concentration of the dispersants LP1, Decanoyl, Benzoyl, valeryl in the figures is 5 to 6% based on fillers and dispersant weight. Comparing curves 1 and 2 in FIG. 1a, it can be seen that for a gain of 8 vol % loading, achieved through the use of mixed grades of particles, the viscosity has decreased by a factor of a few (upto an order of magnitude depending upon the shear rate). A further decrease (up to 40-50%) in viscosity is seen (curves 2 and 3) when, in addition to the mixed particle sizes, a different dispersant is used.

Figure 1B:
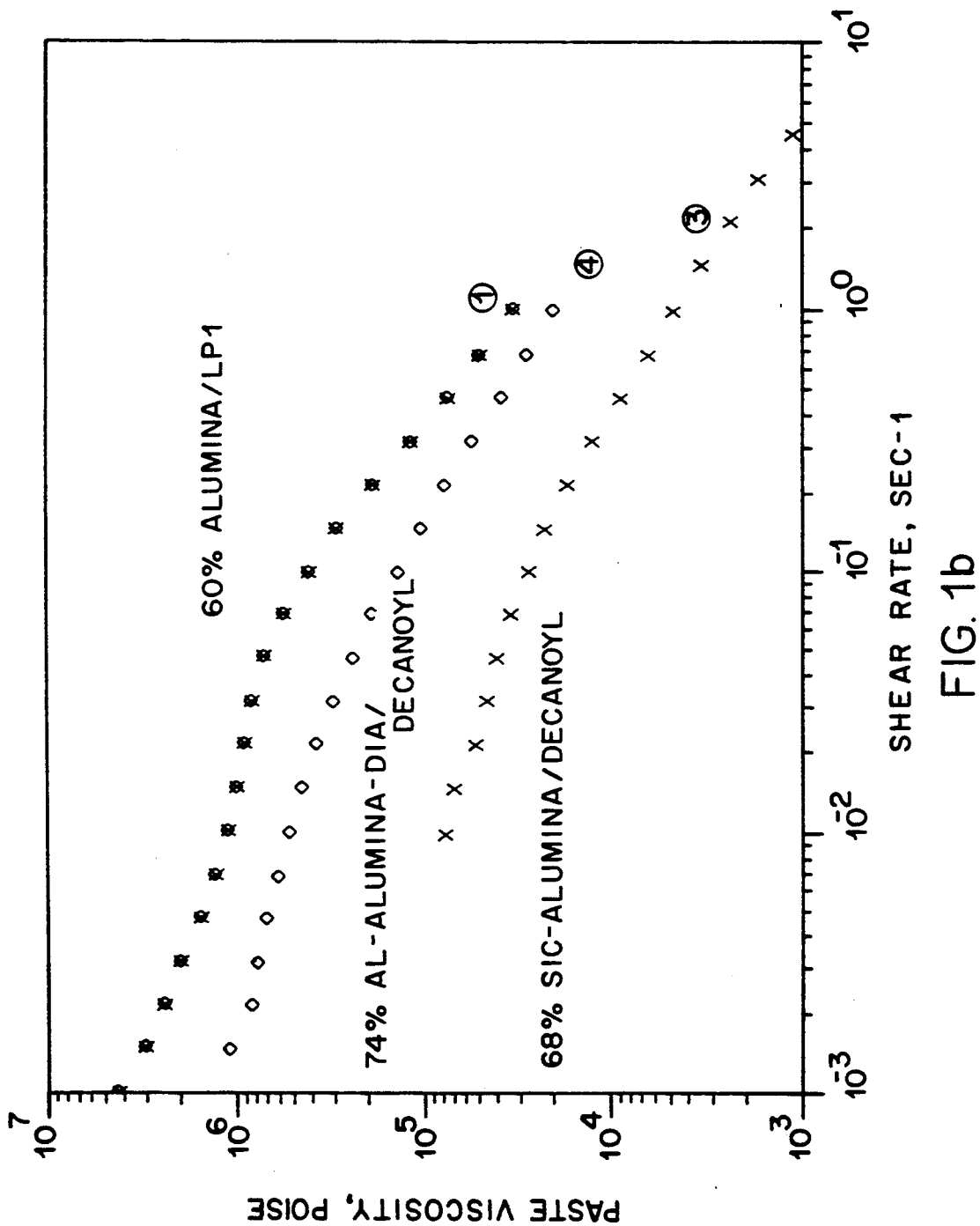

Curves 1 and 4 in FIG. 1b, show that by using mixed particle grades and an effective dispersant, a considerably higher concentration (74%, for example,) can be achieved with the paste viscosity still smaller than the 60 vol % paste made with a single grade of particle "Al" in FIG. 1b is a 1-5$\mu$ size grade aluminum (obtained from Atlantic Equipment Engineers). "Dia" in FIG. 1b is diamond of 0-$\frac{1}{4}\mu$ size grade (obtained from General Electric Super Abrasives) The volume ratio of Al/Alumina/Dia is 60/35/5.

Figure 2:
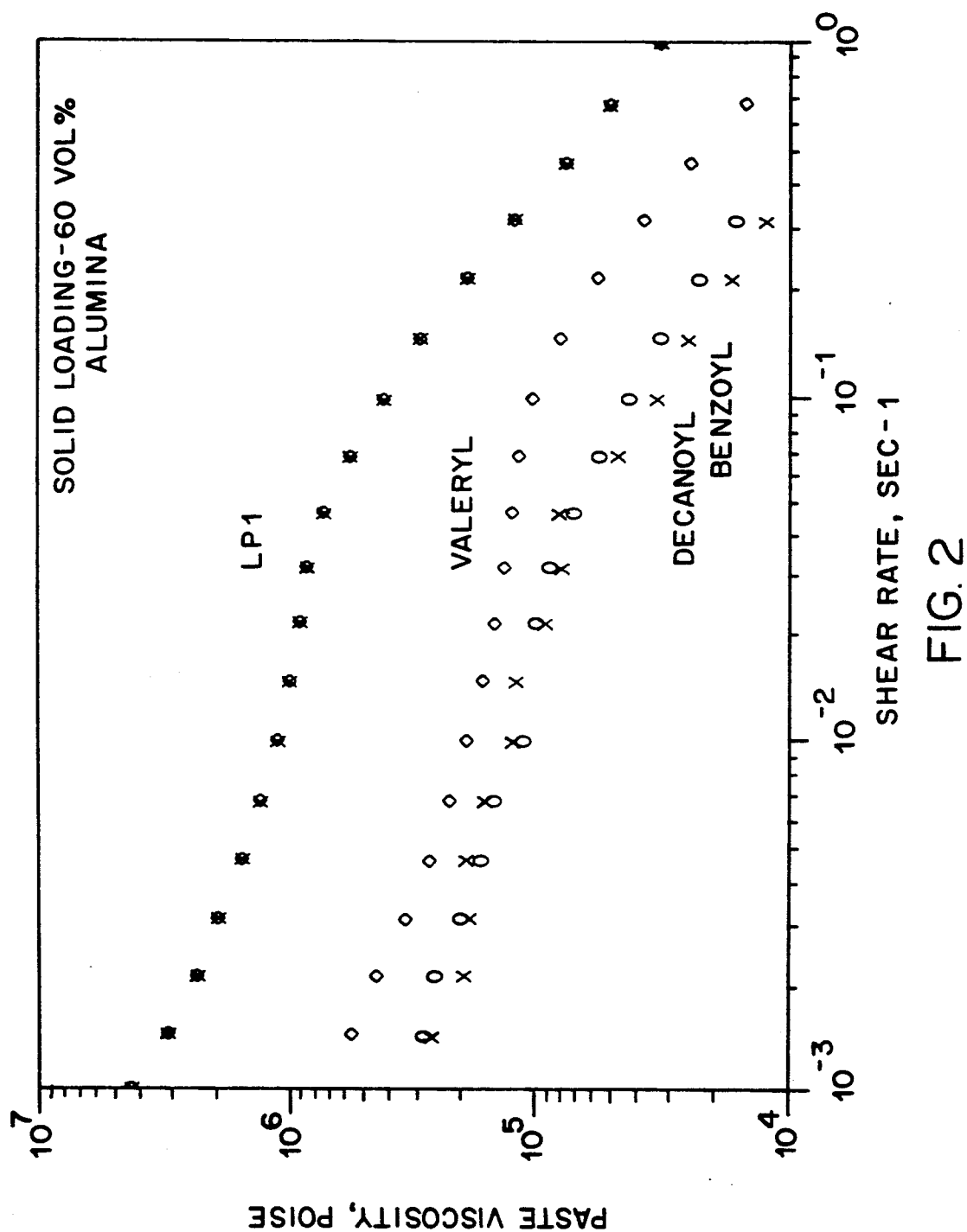
FIG. 2 shows the effect of various dispersants on paste viscosity, at a solid loading of 60 vol %.
Figure 3:
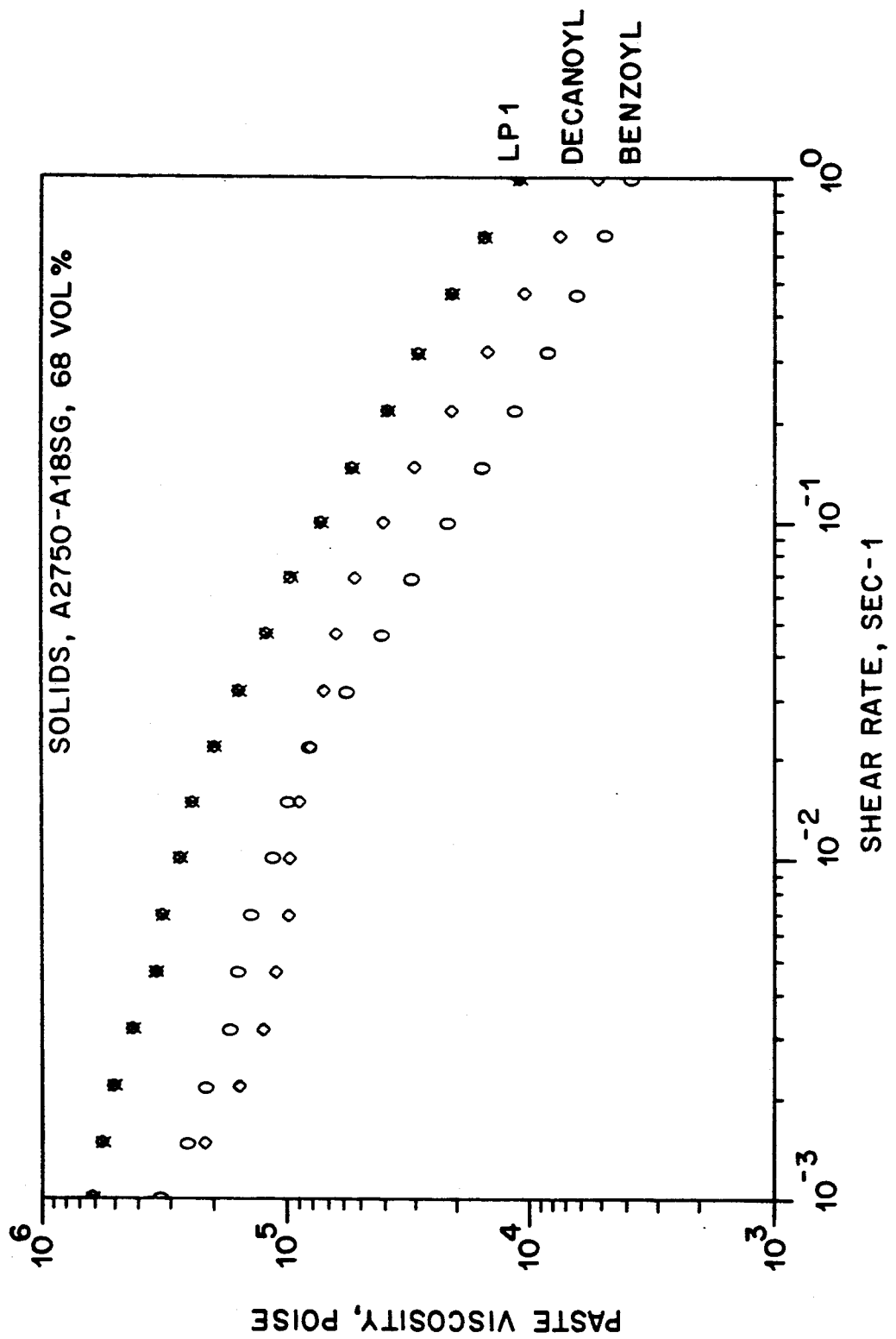
FIG. 3 shows the effect of dispersants on paste viscosity at a solid loading of 68 vol %.

It is seen in FIG. 2 that the dispersants valeryl, decanoyl and benzoyl yield significantly lower viscosity pastes than LP1 at 60 vol % loading. FIG. 3 shows that also at the high vol %, the synthesized dispersants decanoyl and benzoyl yield lower viscosity pastes though the decrease is less pronounced as compared to that at 60 vol %. However, at such high vol %, any decrease in viscosity is desirable. Benzoyl appears to be marginally better than decanoyl in decreasing the viscosity.

EXAMPLE II

The table below represents other examples of pastes, in increasing order of conductivity All of the pastes below were made with mineral oil as the liquid carrier The vol % of mineral oil is 100 minus the sum of filler and dispersant vol %. In the table, Al6SG is a commercial grade of sub-micron alumina having a $\alpha$-$Al_2O_3$ phase content, an average size of 0.5$\mu$ and a surface area of 7-11 m$^2$/g; A2750 is a commercial grade of alumina having a $\alpha$-Al$_2$O$_3$ phase content, an average size of 2.75$\mu$m and a surface area of <1 m$^2$/g; Al is aluminum having a particle size of 1-5$\mu$; LP1 is a Hypermer as discussed above; and 12HSA = 12 hydroxy stearic acid; 12 HSA - Decanoyl, 12 HSA - Benzoyl etc. in column 2 of Table 2 refer to the dispersants obtained by reacting 12 hydroxy stearic acid with Decanoyl chloride, Benzoyl chloride etc., respectively; the size ranges specified in parentheses in column 1 of Table 2 correspond to Diamond particle size.

TABLE 2

| Filler | $\phi$ solids (vol %) | Dispersant type, Concentration W$_D$ % | Filler Volume Composition | Conductivity (K$_{eff}$) W/mK |
|---|---|---|---|---|
| 1. Diamond | 56% | LP1, 5% | 100% | 1.08 |
| 2. SiC | 56% | LP1, 5% | 100% | 1.35 |
| 3. A16SG | 62% | LP1, 5% | 100% | 1.35 |
| 4. A16SG | 62% | LP1, 7.5% | 100% | 1.63 |
| 5. SiC-A16SG | 64% | LP1, 5% | 60/40 | 1.86 |
| 6. A2750-A16SG | 68 | Octanoic, 5% | 60/40 | 2.01 |
| 7. A2750-A16SG | 68 | 12HSA-Decanoyl, 5% | 60/40 | 2.10 |
| 8. A2750-A16SG | 68 | 12HSA-Benzoyl, 5% | 60/40 | 2.12 |
| 9. A16SG-A2750 | 70% | LP1, 5% | 60/40 | 2.17 |
| 10. A2750-A16SG | 68 | Oleic, 5% | 60/40 | 2.18 |
| 11. AlN | 66% | LP1, 5% | 100% | 2.21 |
| 12. A2750-A16SG | 68 | LP1, 5% | 60/40 | 2.23 |
| 13. A16SG-Mixture of Various Sizes of Alumina Particles | 71% | LP1, 5% | 37/63 | 2.28 |
| 14. Diamond-SiC | 68% | LP1, 5% | 50/50 | 2.29 |
| 15. SiC-A16SG | 70% | LP1, 5% | 50/50 | 2.43 |
| 16. AlN-A16SG | 68% | LP1, 5% | 64/36 | 2.45 |
| 17. AlN-A16SG | 70% | LP1, 5% | 60/40 | 2.74 |
| 18. SiC-A16SG | 72% | LP1, 5% | 60/40 | 2.85 |
| 19. Al-A16SG | 70% | LP1, 5% | 60/40 | 2.85 |
| 20. VB$_2$-A16SG | 70% | LP1, 5% | 60/40 | 3.24 |
| 21. AlN-A16SG | 72% | LP1, 5% | 60/40 | 3.25 |
| 22. SiC-A16SG | 68 | 12HSA-Decanoyl, 5% | 60/40 | 3.30 |
| 23. Al-A16SG | 74% | LP1, 5% | 50/50 | 3.40 |
| 24. Al-A16SG | 72% | LP1, 5% | 60/40 | 3.45 |
| 25. Al-A16SG | 74 | LP1, 5% | 60/40 | 4.76/4.96 |
| 26. Al-A16SG | 77% | LP1, 5% | 65/35 | 4.96 (very viscous paste) |
| 27. Al-A16SG-Diamond (0-$\frac{1}{4}\mu$) | 74 | LP1, 5% | 60/30/10 | 5.4 (viscous, hard paste)* |
| 28. Al-A16SG-Diamond ($\frac{1}{4}$-1$\mu$) | 74 | 12HSA-Decanoyl, 5% | 60/35/5 | 5.57 |
| 29. Al-A16SG-Diamond (0-$\frac{1}{4}\mu$) | 76 | 12HSA-Decanoyl, 5% | 62/36/2 | 5.57 |
| 30. Al-A16SG-Diamond ($\frac{1}{4}$-1$\mu$) | 74 | 12HSA-Decanoyl, 5% | 60/35/5 | 5.57/4.95 (viscous, hard paste)* |
| 31. Al-A16SG-Diamond ($\frac{1}{4}$-1$\mu$) | 76 | 12HSA-Decanoyl, 5% | 60/5/35 | 6.03 (viscous, hard paste)* |
| 32. Al-A16SG-Diamond (0-$\frac{1}{4}\mu$) | 78 | 12HSA-Decanoyl, 3.5% | 64/31/5 | 6.58* |
| 33. Al-A16SG | 78 | 12HSA-Decanoyl, 3.5% | 64/36 | 6.95/6.25 |
| 34. Al-A16SG | 80 | 12HSA-Decanoyl, 3% | 64/36 | 8.58 (very viscous, paste) |

*These pastes were observed to harden over a period of a few months.

It is also within the scope of this invention that using procedures described herein, highly thermally and electrically conducting pastes may be prepared using metallic fillers such as Cu, Ag and Au etc.; electrically conducting liquid carriers such as glycerin, glycols etc; and ionic and nonionic dispersants, in addition to the dispersants described above.

Applications for the pastes of this invention are not limited to electronic and electrical devices.

Other embodiments of the invention will be apparent to the skilled in the art from a consideration of this specification or practice of the invention disclosed herein. It is intended that the specification and examples be considered as exemplary only, with the true scope and spirit of the invention being indicated by the following claims.

What is claimed is:

1. A paste comprising a thermally conducting solid filler selected from the group consisting of Al, Cu, Ag, SiC, AlN, BN, Diamond, VB, VB$_2$, Al$_2$O$_3$, ZnO, MgO, SiO$_2$ and mixtures thereof; a stabilizing dispersant selected from the group consisting of monomer fatty acid esters and salts thereof, oligomer fatty acid esters and salts thereof, polymer fatty acid esters and salts thereof, petroleum sulfonates, polyimides and polyesters; nonaqueous electrically resistive liquid carrier capable of forming a continuous phase with said dispersant; said paste containing between 5 and 40 volume percent liquid carrier; between 1 and 20 percent stabilizing dispersant based upon weight of solid filler; between 55 and 80 volume percent solids consisting of solid filler and dispersant; said paste being highly concentrated, stable, thermally conducting and electrically resistive.

2. The paste as recited in claim 1 wherein said paste is of a viscosity of $10^6$–$10^3$ poise.

3. The paste as recited in claim 1 wherein the thermal conductivity of the solid filler is at least about 1.0 Watt/mK.

4. The paste as recited in claim 1 wherein the thermal conductivity of the solid filler is at least about 30 Watt/mK.

5. The paste as recited in claim 1 wherein the solid filler is a metallic filler.

6. The paste as recited in claim 1 wherein the solid filler is of a particle size between about $0.05\mu$ and $10\mu$.

7. The paste as recited in claim 1 wherein the paste comprises between about 60 to about 78 vol % solids.

8. The paste as recited in claim 1 wherein the paste comprises between about 5 to about 40 vol % of the liquid carrier.

9. The paste as recited in claim 1 wherein the paraffinic hydrocarbon is mineral oil.

10. The paste as recited in claim 1 wherein the monomer fatty acid ester is an ester of 12 hydroxy stearic acid.

11. The paste as recited in claim 1 wherein the paste has a viscosity of between about $10^3$ to about $10^6$ poise over a shear rate range of about $10^{-3}$ to about $10^1$ sec$^{-1}$.

12. The paste as recited in claim 1 wherein the paste has a thermal conductivity of greater than bout 1.0 Watt/mK.

13. The paste as recited in claim 1 wherein the paste has a thermal conductivity of greater than about 3 Watt/mK.

14. The paste as recited in claim 13 wherein the paste has a thermal conductivity of between about 3 Watt/mK to about 6 Watt/mK.

* * * * *